(12) United States Patent
Morche

(10) Patent No.: US 12,289,124 B2
(45) Date of Patent: Apr. 29, 2025

(54) TRANSMITTER DEVICE AND METHODS FOR PREDISTORTION AND DECORRELATION OF NOISE IN SUCH A TRANSMITTER DEVICE

(71) Applicant: COMMISSARIAT A L'ENERGIE ATOMIQUE ET AUX ENERGIES ALTERNATIVES, Paris (FR)

(72) Inventor: Dominique Morche, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/234,231

(22) Filed: Aug. 15, 2023

(65) Prior Publication Data

US 2024/0072831 A1 Feb. 29, 2024

(30) Foreign Application Priority Data

Aug. 30, 2022 (FR) ...................................... 2208651

(51) Int. Cl.
*H04K 1/02* (2006.01)
*H04B 1/04* (2006.01)
(52) U.S. Cl.
CPC ... *H04B 1/0475* (2013.01); *H04B 2001/0425* (2013.01)
(58) Field of Classification Search
CPC ....................... H04B 1/0475; H04B 2001/0425
(Continued)

(56) References Cited

U.S. PATENT DOCUMENTS

2005/0110562 A1 5/2005 Robinson et al.
2008/0278360 A1* 11/2008 Koli ................... H03H 17/0251
341/143

(Continued)

FOREIGN PATENT DOCUMENTS

WO 2020/105040 A1 5/2020

OTHER PUBLICATIONS

Qian, et al., "A General Adaptive Digital Predistortion Architecture for Stand-Alone RF Power Amplifiers", IEEE Transactions on Broadcasting, vol. 59, No. 3, pp. 528-538, Sep. 2013.

(Continued)

*Primary Examiner* — Zewdu A Kassa
(74) *Attorney, Agent, or Firm* — BakerHostetler

(57) ABSTRACT

A multichannel transmitter device includes, on each channel: a transmission processing channel designed to process an input signal and comprising a predistortion block applying a predistortion to the input signal on the basis of predistortion coefficients, a DAC, a first analogue filter, a power amplifier and a sigma-delta encoder between the predistortion block and the digital-to-analogue converter and designed to carry out notably a quantization of the predistortion block; a return channel associated with the transmission processing channel and comprising a block for estimating predistortion coefficients so as to estimate predistortion coefficients on the basis of the input signal and of a feedback signal; the transmitter device wherein the block for estimating predistortion coefficients is designed to estimate the predistortion coefficients on the basis of at least the input signal and of a signal resulting from the subtraction, from the feedback signal, of a signal representing the quantization noise resulting from the quantization carried out by the sigma-delta encoder.

10 Claims, 7 Drawing Sheets

(58) Field of Classification Search
USPC .............................. 375/296, 295, 219, 316
See application file for complete search history.

(56) References Cited

U.S. PATENT DOCUMENTS

2010/0254441 A1* 10/2010 Kenington ............ H03F 1/3282
                                                                                                                         375/296
2012/0269291 A1    10/2012 Wang et al.

OTHER PUBLICATIONS

Pham, et al., "Impact of subband quantization on DPD correction performance", 2013 IEEE 20th International Conference on Electronics, Circuits, and Systems (ICECS), 2013.

Boo, et al., "Adaptive Predistortion Using a ΔΣ Modulator for Automatic Inversion of Power Amplifier Nonlinearity", IEEE Transactions on Circuits and Systems II: Express Briefs, vol. 56, No. 12, pp. 901-905, Dec. 2009.

Othmani, et al., "Delta-Sigma Modulator-Embedded Digital Predistortion for 5G Transmitter Linearization", IEEE Transactions on Communications, vol. 70, Issue: 8, pp. 5558-5571, 2022.

* cited by examiner

FIG.1 - PA

TRANSMITTER DEVICE AND METHODS FOR PREDISTORTION AND DECORRELATION OF NOISE IN SUCH A TRANSMITTER DEVICE

CROSS-REFERENCE TO RELATED APPLICATION

This application claims priority to foreign French patent application No. FR 2208651, filed on Aug. 30, 2022, the disclosure of which is incorporated by reference in its entirety.

FIELD OF THE INVENTION

The invention lies in the field of signal transmission devices comprising a power amplifier and carrying out a digital predistortion operation to compensate for the non-linearity of this power amplifier.

BACKGROUND

Predistortion is a known operation (cf. for example H. Qian, H. Huang and S. Yao, "A General Adaptive Digital Predistortion Architecture for Stand-Alone RF Power Amplifiers," in *IEEE Transactions on Broadcasting*, vol. 59, no. 3, pp. 528-538, September 2013) that consists in compensating for the nonlinearity of the amplifier by adding an inverse nonlinearity to the signal presented to the input thereof, so as to obtain a linear transfer function for the assembly comprising the predistortion module and the amplifier.

FIG. 1 shows a basic diagram that illustrates one example of a known transmitter device architecture with predistortion. It comprises a transmission processing channel receiving the payload signal in baseband and that, on each of two processing chains I, Q, one of which is intended to selectively process the in-phase signal (I) and the other of which is intended to selectively process the phase quadrature signal (Q), comprises a digital predistortion block followed by a digital-to-analogue converter (DAC), an analogue filter for suppressing noise, a frequency change stage (optional) for transposing the signal onto a carrier (only one processing chain is shown in FIG. 1). The processing channel lastly comprises a power amplifier (PA).

The digital predistortion block carries out a predistortion operation based on predistortion coefficients.

The transmitter device furthermore comprises a return channel that makes it possible to determine the effects of the variation of the gain of the power amplifier as a function of the power of the digital signal supplied at input of the transmission processing channel. A coupler (or any other measuring device) is used at output of this power amplifier to obtain the signal at output of the power amplifier. The return channel comprises a frequency change stage (optional) for transposing the signal into baseband and, on each of two processing chains, one of which is intended to selectively process the in-phase signal (I) and the other of which is intended to selectively process the phase quadrature signal (Q) (only one of these chains is shown in FIG. 1), an analogue filter, an analogue-to-digital converter (ADC), a block for estimating predistortion coefficients, designed to carry out this estimation on the basis of at least the signal at output of the converter and the payload signal at input of the transmission processing channel. The updated predistortion coefficients are then delivered to the predistortion block (of the chain I, respectively Q), which uses them to carry out the following predistortions.

The nonlinearities of the power amplifier create harmonics of the signal, which are shown in FIG. 2, illustrating the spectrum of the signal at output of the amplifier. The power of the payload signal supplied at input of the transmission processing channel is shown as a function of frequency in hatched form. The signal has a bandwidth +/− B with respect to the centre frequency. The nonlinearity conferred by the amplifier is often modelled by a transfer function of the power amplifier in the form of a polynomial. To simplify the explanation, it is assumed here that this polynomial is of order r, with for example r=5. This nonlinearity of the power amplifier will therefore generate noise in the band (in dots in FIG. 2), which will limit the performance of the transmitter device. It will also generate intermodulation products of the input signal that will be located outside the band of the payload signal: in the example under consideration with r=5, from B to 3B for 3rd-order harmonics and from 3B to 5B for 5th-order harmonics.

Many algorithms may be used to extract these nonlinearities. One solution is to focus on the signal outside the bandwidth of the input signal (in the case r=5: in the bands [B,3B] for the 3rd harmonic and [3B,5B] for the 5th harmonic): cf. for example D. G. Pham, P. Desgreys, M. A. Hussein, P. Loumeau and O. Venard, "Impact of subband quantization on DPD correction performance," 2013 IEEE 20th International Conference on Electronics, Circuits, and Systems (ICECS), 2013).

The benefit is that, within these bandwidths, the intermodulation products, resulting from the distortion of the signal, are isolated from the input signal, situated at a lower frequency. Analysing these various bands will also make it possible to be able to dissociate the various coefficients of the nonlinear model.

The solution described here is a conventional approach that exhibits the drawback of potentially needing a DAC with a large number of bits (so as not to degrade the signal-to-noise ratio of the signal in the band and outside the band). This high number of bits is detrimental because it involves significant complexity for the DAC (which will lead to a large surface area and high consumption) and, if the DAC and the digital circuit for generating modulated signals are separate, it is necessary to have numerous digital outputs at output of the digital circuit for modulating data and numerous inputs on the circuit containing the DAC. This phenomenon is all the more problematic in multichannel transmitter devices, since it is necessary to multiply the number of bits of the DAC by the number of channels to obtain the number of bits to be transferred.

It is known to position a sigma-delta encoder upstream of the DAC: cf. H. H. Boo, S. W. Chung and J. L. Dawson, "Adaptive Predistortion Using a $\Delta\Sigma$ Modulator for Automatic Inversion of Power Amplifier Nonlinearity," in IEEE Transactions on Circuits and Systems II: Express Briefs, vol. 56, no. 12, pp. 901-905, December 2009.

This solution makes it possible to reduce the number of bits of the DAC in return for having a high sampling frequency so as to benefit from a good oversampling factor, which is necessary for sigma-delta encoding. This constraint is not necessarily detrimental in the architecture of the transmitter device since it is common to use a high sampling frequency in the transmission DAC so as not to excessively constrain the analogue filter following this same DAC. In the approach proposed by Boo et al., it is shown that the use of the sigma-delta encoder upstream of the DAC also makes it possible to simplify the implementation of the predistortion by avoiding having to invert the transfer function of the amplifier. It makes it possible to use a simple look-up table to model the nonlinear behaviour of the DAC in order to compensate for that of the PA. The main drawback of this architecture is that the quantization noise caused by the sigma-delta encoding, the power of which increases as a function of frequency from the end of the bandwidth of the signal, has to be filtered out by an analogue filter with a low cutoff frequency, thereby placing severe constraints on the analogue filter. In addition, in the example under consideration, there is no predistortion actually put in place for the amplifier. If it were to be desired to use a predistortion, it would potentially be necessary to increase the bandwidth of the DAC and therefore increase the sampling frequency by as much so as to keep a constant oversampling factor.

FIG. 3 illustrates the spectrum of the quantization noise added by a sigma-delta encoder when it is positioned upstream of the DAC in a transmitter device of the type of FIG. 1, as explained above, but without any predistortion operation. The spectrum of the payload signal is shown in hatched form, the curve Q1 represents the quantization noise generated by the sigma-delta encoder (low in the band +B/−B), the dashed curve FA1 represents the analogue filtering that follows the DAC, which, as in the example given by Boo et al., eliminates the quantization noise outside the bandwidth+B/−B.

In the example of FIG. 4, predistortion is implemented and the nonlinearity noise of the amplifier is represented by dots: the quantization noise Q2 generated by the sigma-delta encoder should be attenuated over a wider bandwidth, and therefore the required sampling frequency will be higher, this being problematic when the bandwidth of the input signal is large.

SUMMARY OF THE INVENTION

To this end, according to a first aspect, the present invention describes a transmitter device comprising N channels Vi, i=1 to N≥1, each of said channels Vi comprising:
- a transmission processing channel designed to process an input signal and comprising a predistortion block, a digital-to-analogue converter, a first analogue filter and a power amplifier, said transmitter device comprising a transducer device coupled to said processing channel and receiving the input signal once it has been processed by said processing channel, the predistortion block being designed to apply a predistortion to said input signal, on the basis of predistortion coefficients, so as to compensate for the nonlinearities of the power amplifier;
- a return channel associated with the transmission processing channel, designed to receive the signal processed by the processing channel and comprising a second analogue filter, an analogue-to-digital converter, and a block for estimating predistortion coefficients, said block for estimating predistortion coefficients being designed to estimate predistortion coefficients, on the basis of at least said input signal and of a signal, called feedback signal, obtained following at least the successive operations, on the received processed signal, of filtering performed by the second filter and conversion performed by the analogue-to-digital converter, and to deliver said estimated predistortion coefficients to the predistortion block;
- wherein the processing channel furthermore comprises a sigma-delta encoder between the predistortion block and the digital-to-analogue converter, designed to carry out notably a quantization;
- said transmitter device being characterized in that the block for estimating predistortion coefficients is designed to estimate said predistortion coefficients on the basis of at least said input signal and of a signal resulting from the subtraction, from said feedback signal, of a signal representing the quantization noise resulting from the quantization carried out by the sigma-delta encoder.

The invention thus proposes to cancel out the quantization noise generated by a sigma-delta encoder arranged upstream of the DAC in bands outside the band B/−B of the input payload signal (from B to 5B in the example mentioned above with r=5 or more depending on the predistortion) in the feedback loop. It is thus possible to keep a moderate sampling frequency of the DAC.

In some embodiments, such a device will furthermore comprise at least one of the following features:
- said signal representing the quantization noise is a function of said quantization noise shaped by the noise transfer function NTF(z) of the sigma-delta encoder;
- the wireless transmitter device is designed to obtain said signal representing the quantization noise by carrying out at least one of said following operations:
  - filtering and decimation so as to adapt the sampling frequency and the bandwidth of the signal representing the quantization noise to the input signal;
  - filtering so as to reproduce at least the effect of the first and second filters;
  - FIR filtering so as to reproduce the effect of the first and second filters, the transfer function of said FIR filtering being estimated on the basis of the comparison between said feedback signal and a signal obtained from the quantization noise extracted from the sigma-delta encoder;
- N>1;
- the size of data paths in the block for estimating predistortion coefficients in each channel is oversized so as to introduce additional nonlinearities; and/or
- the transmitter device comprises a control block designed, in a preliminary transitional phase, to trigger the supply of deterministic signals to the input of the digital-to-analogue converters, such that, given any two separate channels, the amplitude and/or the frequency of these deterministic signals is different between said channels.

According to another aspect, the invention describes a method for predistortion in a transmitter device comprising N channels Vi, i=1 to N≥1, each of said channels Vi comprising:
- a transmission processing channel designed to process an input signal and comprising a predistortion block, a digital-to-analogue converter, a first analogue filter and a power amplifier, said transmitter device comprising a transducer device coupled to said processing channel and receiving the input signal once it has been processed by said processing channel, the predistortion block being designed to apply a predistortion to said input signal, on the basis of predistortion coefficients, so as to compensate for the nonlinearities of the power amplifier;
- a return channel associated with the transmission processing channel, designed to receive the signal processed by the processing channel and comprising a second analogue filter, an analogue-to-digital converter, and a block for estimating predistortion coefficients;

wherein the processing channel furthermore comprises a sigma-delta encoder between the predistortion block and the digital-to-analogue converter, designed to carry out notably a quantization;

said method comprising a step of estimating the predistortion coefficients performed by said block for estimating predistortion coefficients, on the basis of at least said input signal and of a signal, called feedback signal, obtained following at least the successive operations, on the received processed signal, of filtering performed by the second filter and conversion performed by the analogue-to-digital converter, said estimated predistortion coefficients being delivered to the predistortion block;

said method being characterized in that the block for estimating predistortion coefficients estimates said predistortion coefficients on the basis of at least said input signal and of a signal resulting from the subtraction, from said feedback signal, of a signal representing the quantization noise resulting from the quantization carried out by the sigma-delta encoder.

In some embodiments, such a method will furthermore comprise at least one of the following features:

said signal representing the quantization noise is a function of said quantization noise shaped by the noise transfer function NTF(z) of the sigma-delta encoder;

said signal representing the quantization noise is obtained by carrying out at least one of said following operations:

filtering and decimation so as to adapt the sampling frequency and the bandwidth of the signal representing the quantization noise to the input signal;

filtering so as to reproduce at least the effect of the first and second filters;

FIR filtering so as to reproduce the effect of the first and second filters, the transfer function of said FIR filtering being estimated on the basis of the comparison between said feedback signal and a signal obtained from the quantization noise extracted from the sigma-delta encoder.

According to another aspect, the invention describes a method for decorrelation of quantization noise in a transmitter device, wherein a predistortion method according to the invention is implemented on each of the channels Vi, i=1 to N, with N an integer >1.

In some embodiments, this method comprises the following steps:

the size of data paths in the block for estimating predistortion coefficients in each channel is oversized so as to introduce additional nonlinearities; and/or in a preliminary transitional phase, deterministic signals are supplied to the input of the digital-to-analogue converters, such that, given any two separate channels, the amplitude and/or the frequency of these deterministic signals is different between said channels.

BRIEF DESCRIPTION OF THE DRAWINGS

The invention will be better understood and other features, details and advantages will become more clearly apparent on reading the following non-limiting description, and by virtue of the appended figures, which are given by way of example.

Identical references may be used in different figures to designate identical or comparable elements.

DETAILED DESCRIPTION

Figure 6:
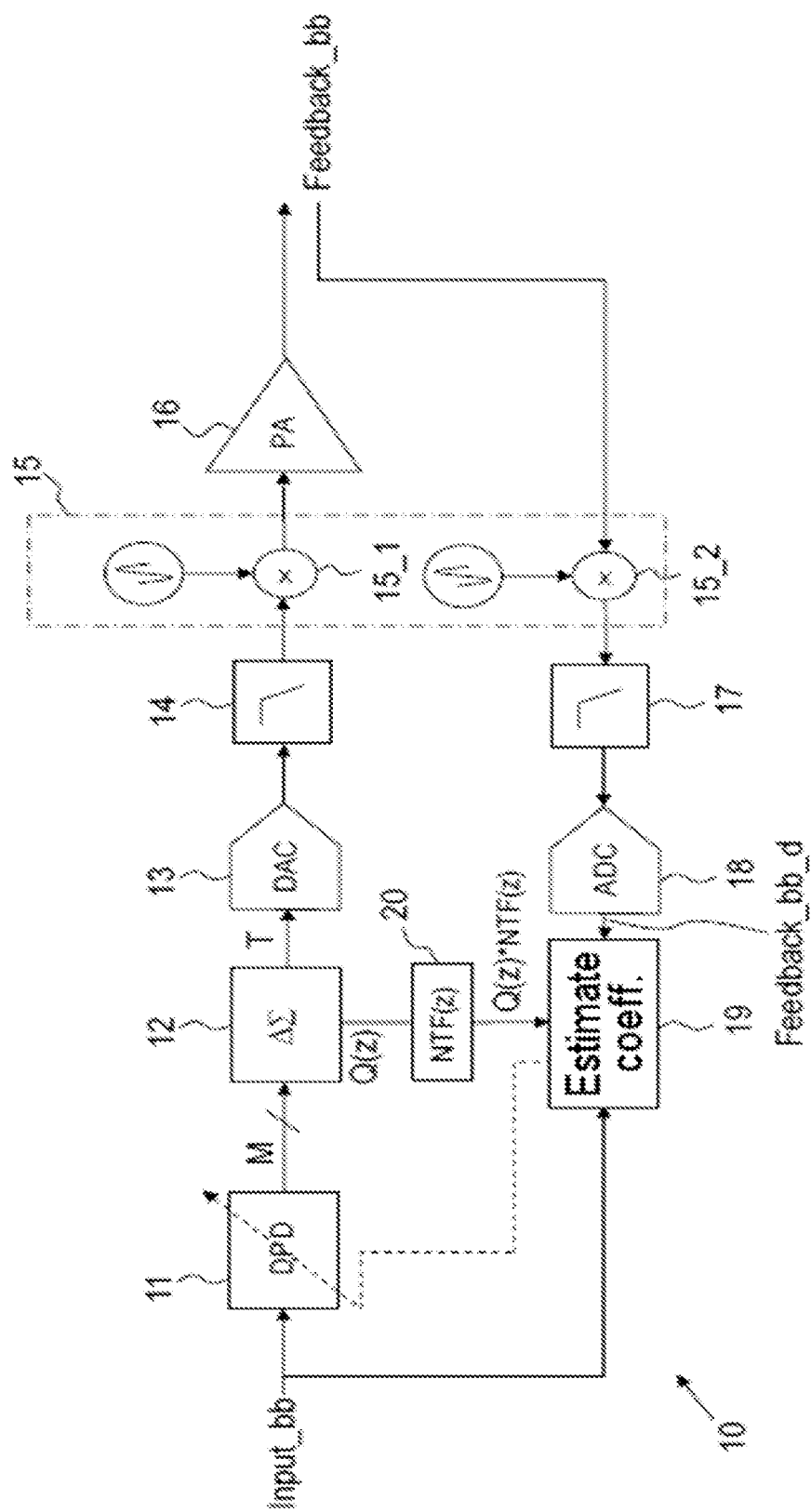
FIG. 6 is an illustration of an architecture of a transmitter device carrying out predistortion processing in one embodiment of the invention.

FIG. 6 shows a basic diagram of a transmitter device 10 in one embodiment of the invention, in one non-limiting example of a wireless telecommunications transmitter device, here a radiofrequency one (it will be noted notably that any quadrature signal I/Q channels are not shown for clarity reasons).

The transmitter device 10 comprises at least one transmission processing channel and one return channel associated with this transmission processing channel.

The transmission processing channel comprises, from the input to the output of the transmission processing channel, on each of two processing chains I, Q (a single chain being shown): a digital predistortion block (DPD) 11, a sigma-delta encoder 12, a digital-to-analogue converter (DAC) 13, a low-pass filter 14, and a frequency change stage (up-conversion) 15_1. The processing channel then comprises, downstream of the two processing chains I, Q, a power amplifier (PA) 16. Said processing channel is designed to obtain, at output of the PA, the signal to be transmitted, destined here for an RF antenna.

The return channel associated with this transmission processing channel comprises, from its input to its output, a frequency change stage (down-conversion) 15_2, and then, on each of two parallel processing chains I, Q (a single chain being shown), a low-pass filter 17 and an analogue-to-digital converter (ADC) 18. The return channel lastly comprises a block for estimating predistortion coefficients 19 receiving the outputs from the ADCs 18 at input.

The device 10 comprises, in this case, an optional noise-shaping block 20 arranged between the sigma-delta encoder 12 and the estimation block 19 and to which the quantization noise from the sigma-delta encoder 12 is applied.

The return channel is designed to obtain the signal at output of the PA 16 and determine the predistortion coefficients defining the nonlinearity on the basis of said signal at output of the PA 16.

The block 15 comprising the frequency change stages 15_1 and 15_2 is itself also optional.

The invention comprises subtracting the quantization noise extracted from the sigma-delta encoder 12 obtained for a digital signal at input of the processing channel, called input_bb, from the signal delivered at output of the PA 16 for this same input signal input_bb, and then the nonlinearities of the PA 16 as a function of power are evaluated by the estimation block 19 by comparing the result of this subtraction (that is to say the signal at output of the PA 16 corresponding to the input signal input_bb minus the quantization noise) and the input signal input_bb.

By thus cancelling out the quantization noise in the estimation block 19, the constraints in relation to the transmission processing channel in terms of quantization noise and sampling frequency are able to be reduced.

The block DPD 11 is designed to carry out a digital predistortion on a digital signal that is supplied thereto at input, intended to compensate for the nonlinearities of the PA 16 in digital mode, on the basis of predistortion coefficients calculated by the estimation block 19, for example by increasing the power of the signal at input for power values for which the PA 16 provides an attenuation. The effects of nonlinearities of the PA 16 will thus be reduced (less noise in the band and outside the band), and it will be possible to use the PA 16 with a higher output power, and it will therefore thus be possible to improve energy efficiency.

The techniques that are implemented are varied and known to a person skilled in the art: for example, LUT (look-up table)-based predistortion or mathematical model-based predistortion.

The LUT is a memory table that supplies, for a value of a signal at input input_bb, a corresponding value at output on the basis of predistortion coefficients that it contains, which are adapted on the basis of the distortions generated by the amplifier 16.

Mathematical model-based predistortion is based on the mathematical modelling of nonlinear systems to determine the inverse characteristic of the amplifier. Models derived from the Volterra series are for example known, such as the polynomial model, the models from the Hammerstein-Wiener family or the NARMA model, etc. Coefficients of a model are thus calculated on the basis of the input and output signals of the amplifier, according to an error minimization criterion.

The sigma-delta encoder 12 here is a digital-to-digital sigma-delta encoder that receives a string of bits, with a precision of M bits, and delivers a string of bits with a precision of T bits, with T<M, and M and T being integers.

A sigma-delta encoder 12, as is known, is a feedback loop-based device carrying out encoding on a small number of bits (for example, one or two or fewer than 5, etc.), and a high sampling frequency compared to the bandwidth of the signal to be encoded. This device shapes the spectrum of the quantization noise by shifting its power into a frequency band not occupied by the spectrum of the payload signal. This spectral separation makes it possible, by virtue of filtering the encoded signal, to keep a signal-to-noise ratio compliant with given specifications.

The sigma-delta encoder 12 generally comprises:
an input for receiving a digital input signal, coded on M bits;
an output for delivering an output digital value coded on T bits, here delivered to the DAC 13; and
one or more sigma-delta cells arranged between the input and the output of the encoder.

Each cell may be first-order or higher-order. Notably, some of them may be first-order, and others higher-order.

Each sigma-delta cell comprises at least the following elements:
a subtractor comprising a first input, a second input, and an output, the first input being coupled to the input of the encoder so as to receive the input signal or a value derived therefrom;
an integrator comprising an input coupled to the output of the subtractor, and an output; and
a quantizer having an input coupled to the output of the integrator and an output coupled to the second input of the subtractor; the output of the quantizer is furthermore coupled to the output of the encoder so as to deliver the output digital value or a contribution thereto.

The encoder 12 is characterized by its transfer function, linking its output signal S_OUT to its input signal S_IN and to the quantization noise Q, and therefore the expression of the transform into z is as follows:

$$S\_OUT(z)=S\_IN \cdot STF(z)+Q \cdot NTF(z)$$

where STF is the input signal transfer function of the encoder 12 (STF standing for signal transfer function) and NTF is the noise transfer function of the encoder 12 (NTF standing for noise transfer function), expressed here as a function of frequency; Q is the quantization noise, equal to the difference between the output of the quantizer and the input of the quantizer.

The signal transfer function works with a gain of 1 within the bandwidth of interest. The noise transfer function is a high-pass filter function, providing the shaping of the noise: high suppression of the quantization noise in the low frequencies while the quantization noise at the high frequencies outside the bandwidth is increased.

Figure 10:
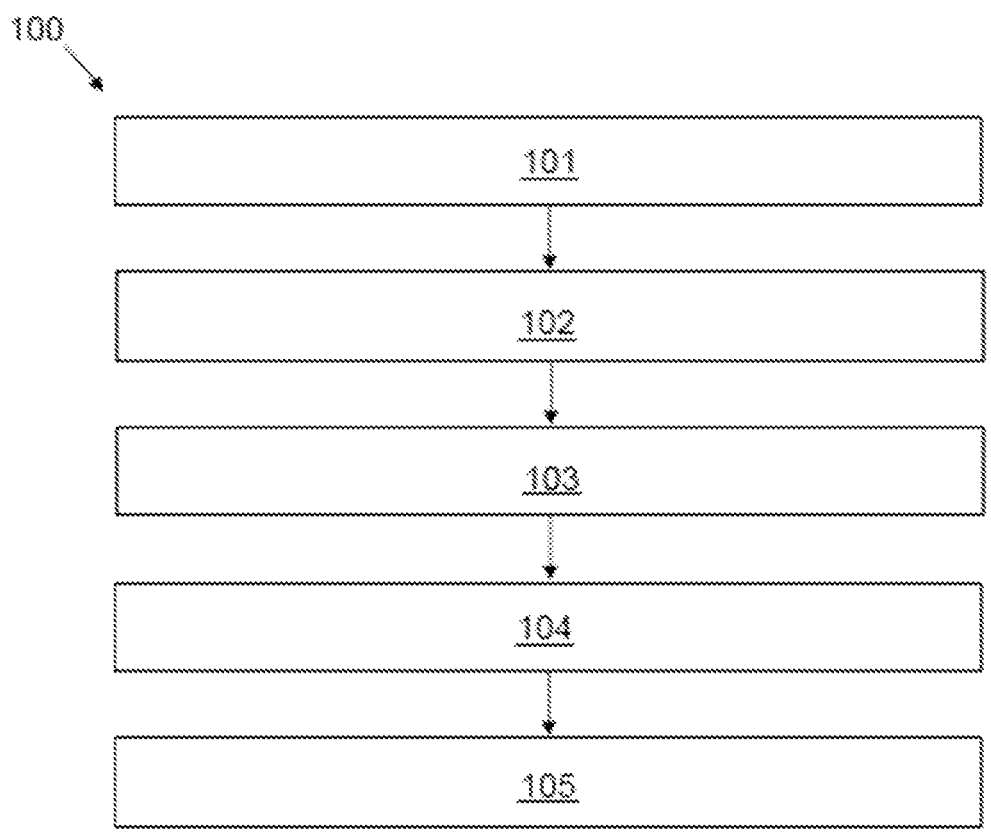
FIG. 10 is an illustration of the steps of a method in one embodiment of the invention.

The steps of a processing method 100 that are implemented by a transmitter device 10 in one embodiment are now described with reference to FIG. 10. They are carried out for example in a calibration step, which may for example take place prior to the operational phase and which, in one embodiment, uses predetermined input signals.

Thus, in a step 101, the following sub-steps are implemented:
101_1: an input digital signal input_bb is supplied at the time t at input of the transmitter device 10; the DPD 11 carries out a predistortion of this signal, on the basis of predistortion coefficients provided last by the estimation block 19 (or else set to a predetermined value, for example to zero);
101_2: the input signal thus predistorted is supplied at input of the sigma-delta encoder 12, which reduces the number of coding bits to T bits; the signal resulting from the processing performed by the sigma-delta encoder 12 at output thereof is supplied at input of the DAC 13;
101_3: the DAC 13 carries out an into-analogue conversion of this signal that is supplied thereto at input and delivers this analogue signal at input of the analogue filter 14;

101_4: the filter 14 carries out low-pass filtering on the signal supplied at input and delivers it to the frequency change stage 15_1;

101_5: the frequency change stage 15_1 transposes the signal that has been supplied thereto at input to the carrier frequency RF and delivers the transposed signal to the PA 16;

101_6: the PA 16 amplifies this signal that is supplied thereto, with nonlinearities, and supplies it to the RF transmission antenna.

In a step 102, which is carried out for example in parallel with sub-steps 101_3 to 101_6, the quantization noise (Q(z)) of the sigma-delta encoder 12 is extracted (for example using a subtractor, not shown, calculating the difference between the input of the sigma-delta encoder 12 and the output of the sigma-delta encoder 12 connected to the DAC 13 and under consideration in step 101_2). Optionally, this quantization noise is then multiplied, in the noise-shaping block 20, by the noise-shaping transfer function NTZ(z) of the sigma-delta encoder 12, so as to obtain Q(z)*NTF(z), which is the shaped quantization noise (as a variant, in some types of encoder 12, Q(z)*NTF(z) is extracted directly). The block 20 optionally delivers a filtered portion of the quantization noise, that is to say Q(z)*H(z) or Q(z)*H(z)*NTF(z), where H(z) is a low-pass or bandpass filter, thereby making it possible to limit the amount of data transiting between the blocks 12 and 19. The quantization noise thus optionally filtered and/or shaped is supplied to the estimation block 19.

In a step 103, the following sub-steps are implemented:

103_1: the amplified signal at the end of sub-step 101_6 above is received at input of the return channel (for example via a coupler coupling the output of the PA 16 to the antenna and the input of the return channel); the signal as received is called Feedback_bb;

103_2: the frequency change stage 15_2 transposes the signal Feedback_bb from the RF carrier frequency into baseband and delivers the transposed signal to the filter 17;

103_3: the filter 17 filters the transposed signal (it suppresses high frequencies) and delivers the filtered signal to the ADC 18;

103_4: the ADC 18 converts the signal that is supplied thereto at input into digital and delivers the resulting digital signal Feedback_bb_d to the estimation block 19.

In a step 104, the estimation block 19 estimates the predistortion coefficients on the basis of the signal input_bb under consideration in step 101, of the signal obtained in step 103_4 delivered by the ADC 18 and of the signal Q(z)*NTF(z) (or Q(z)*H(z)*NTF(z) or Q(z)*H(z) or Q(z)) supplied to the estimation block in step 102. The estimated predistortion coefficients are supplied to the block DPD 11.

In one embodiment, the steps of the method 100 are iterated cyclically after an initialization phase, the predistortion coefficients used by the block DPD 11 thus being updated cyclically; in another embodiment, they are implemented only in a preliminary calibration phase.

Figure 7:
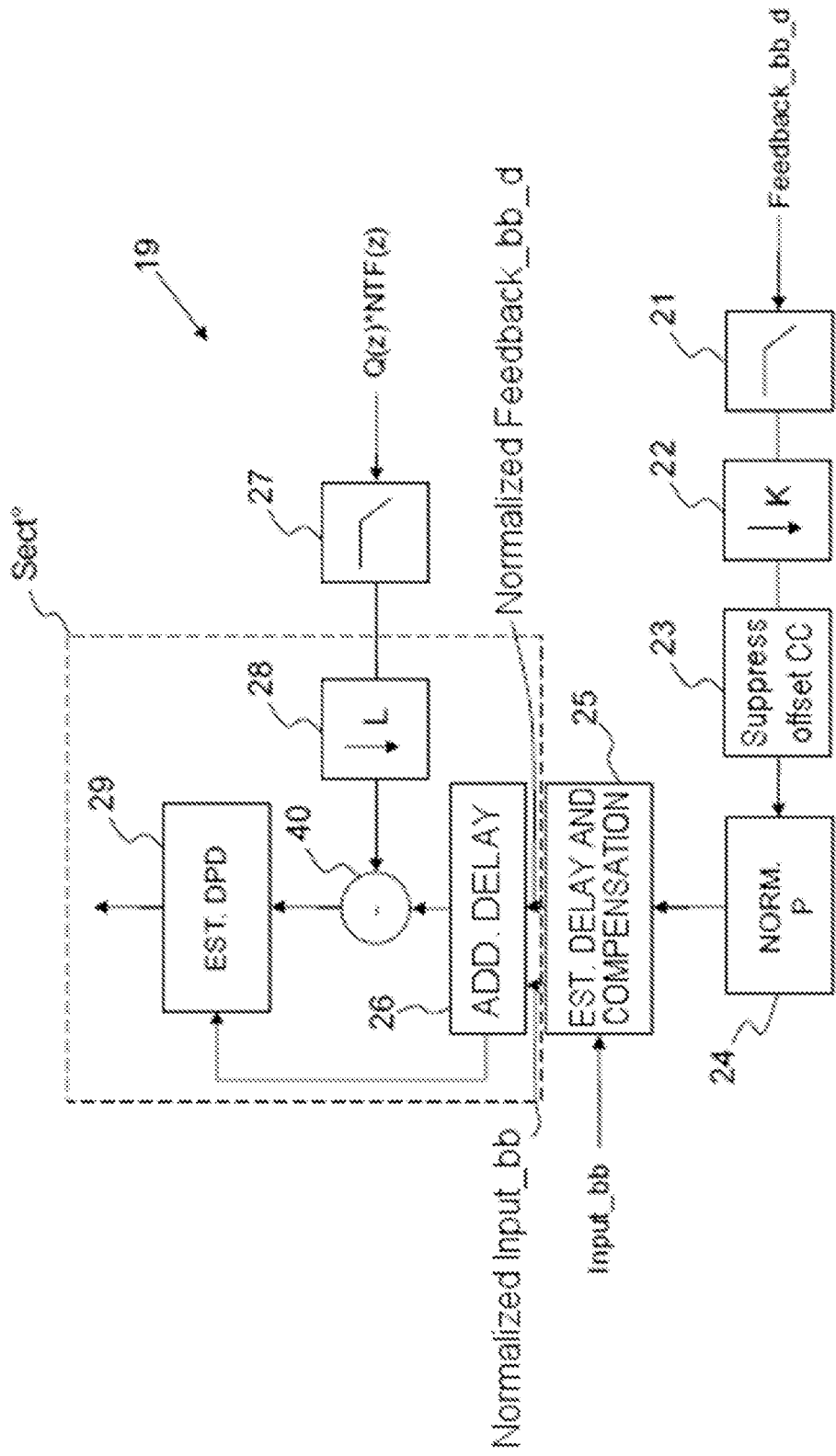
FIG. 7 is an illustration of a block for estimating compensation coefficients in one embodiment of the invention.

FIG. 7 shows a diagram of the estimation block 19 in one embodiment.

Optionally, a filter 21 filters the signal Feedback_bb_d and then a decimator 22 downsamples the filtered signal Feedback_bb_d by a factor K: this makes it possible to return to a sampling frequency similar to the baseband signal. Also optionally, a suppression block 23 eliminates the DC component (DC offset of the signal, which may be significant).

Next, a normalization block 24 normalizes the power of the signal that is supplied thereto by the suppression block 23: indeed, it is necessary, when subsequently comparing the reference signal (baseband input signal input_bb) and the transmitted signal (feedback signal Feedback_bb_d), for these to have the same power. A delay estimation and compensation block 25 compensates for the delay between the input signal and the feedback signal: indeed, the feedback signal that has travelled through the transmission channel and the return channel is delayed with respect to the input signal input_bb under consideration at the time t and from which it results: it therefore has to be resynchronized with the input signal so as to be able to perform a more meaningful comparison. At the end of these processing operations, the delay estimation and compensation block 25 delivers the signals "normalized input_bb" and "normalized feedback_bb".

An additional delay determination block 26 aims to determine the time offset to be applied between these signals and the signal representative of the quantization noise delivered by the noise-shaping block 20 so as to resynchronise them with one another (that is to say that they all result from the input signal input_bb under consideration at the time τ). This (optional) consideration makes the estimation of the predistortion coefficients subsequently carried out by the block 19 more meaningful.

Some operations are for example applied to this quantization noise Q(z)*NTF(z) (or Q(z)*H(z)*NTF(z) or Q(z)*H(z) or Q(z)) before subtracting it from the signal resulting from the feedback signal: it is filtered by a low-pass filter 27, and then downsampled by a factor L by a decimator 28: the purpose of this is to adapt the sampling frequency and the bandwidth of the quantization noise as needed, notably to the baseband signal. It is furthermore possible to filter the quantization noise so as to reproduce the influence of the analogue filter 14 that is located in the transmission processing channel and also the analogue filter 17 that is located in the return channel. It is also possible to use a bandpass filter 27 rather than a low-pass filter.

A subtractor 40 subtracts, from the normalized (and synchronized) feedback signal Feedback_bb_normalized, the signal representing the quantization noise after these filtering operations and decimation where applicable. And a sub-block 29 for estimating coefficients then calculates the predistortion coefficients, in a known manner, so as to compensate for the gain variations of the amplifier depending on the power of the signal at input, on the basis of the normalized and synchronized signals input_bb and of the signal resulting from the subtraction, for example by comparing them.

Figure 8:
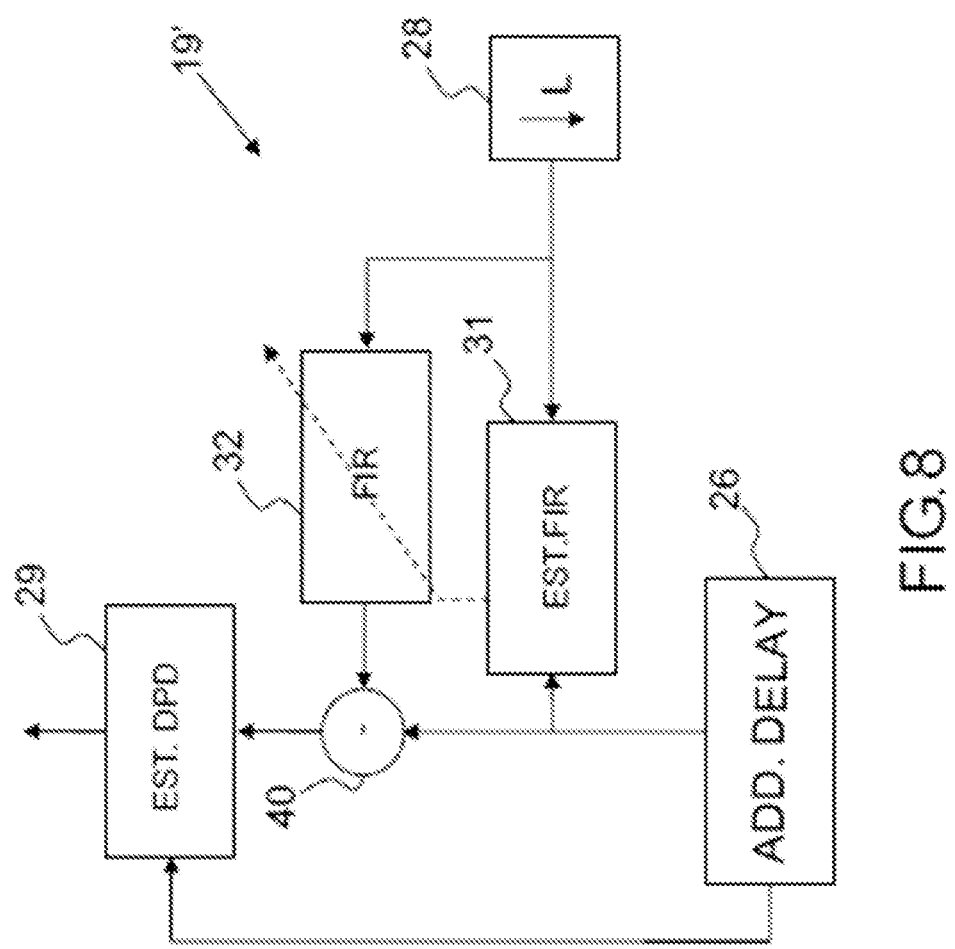
FIG. 8 illustrates part of a block for estimating compensation coefficients in one embodiment of the invention.

In one embodiment, the section Sect of the estimation block 19 in FIG. 7 is replaced, in another embodiment, with the content of FIG. 8. Similar elements between the two figures have the same reference numbers. This embodiment makes it possible to more precisely take into consideration the influence (and its variations over time) of the transfer functions implemented in analogue mode, for example of the low-pass filter 14 following the DAC 13 and, in the return channel (to a lesser extent), of the filter 17 preceding the ADC 18, which may have an influence on the spectrum of the quantization noise as is found in the feedback signal.

In one embodiment, these transfer functions are modelled by a finite impulse response digital filter 32 (FIR standing for "finite impulse response"), and the transfer function of this filter is estimated by an FIR estimation block 31, which evaluates the coefficients of this real transfer function by comparing the signal received by the return channel and the quantization noise, isolated through extraction from the sigma-delta encoder.

The operation of cancelling out the quantization noise is carried out in the estimation block 19, in the example detailed above, because it comprises normalizing the power of the signals and compensating for a delay; but it may instead be carried out outside this block 19.

Figure 5:
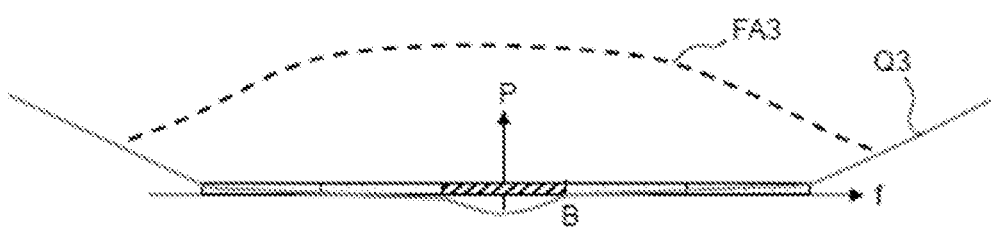
FIG. 5 is a schematic depiction of the spectrum of the signal at output of the power amplifier in a transmitter device comprising a sigma-delta encoder and a noise-shaping filter and carrying out predistortion processing in one embodiment of the invention.

FIG. 5 shows:
- the spectrum (in hatched form) of the input signal of the transmitter device in the embodiment under consideration of the invention occupying +B/−B, the spectrum Q3 of the quantization noise as it will appear in the block 19 for estimating the coefficients after cancelling out the quantization noise in the band +/−5B,
- the analogue filtering FA3 performed by the filter 14 arranged after the DAC 13,
- the nonlinearity noise due to the amplifier 16, in dots.

Figure 1:
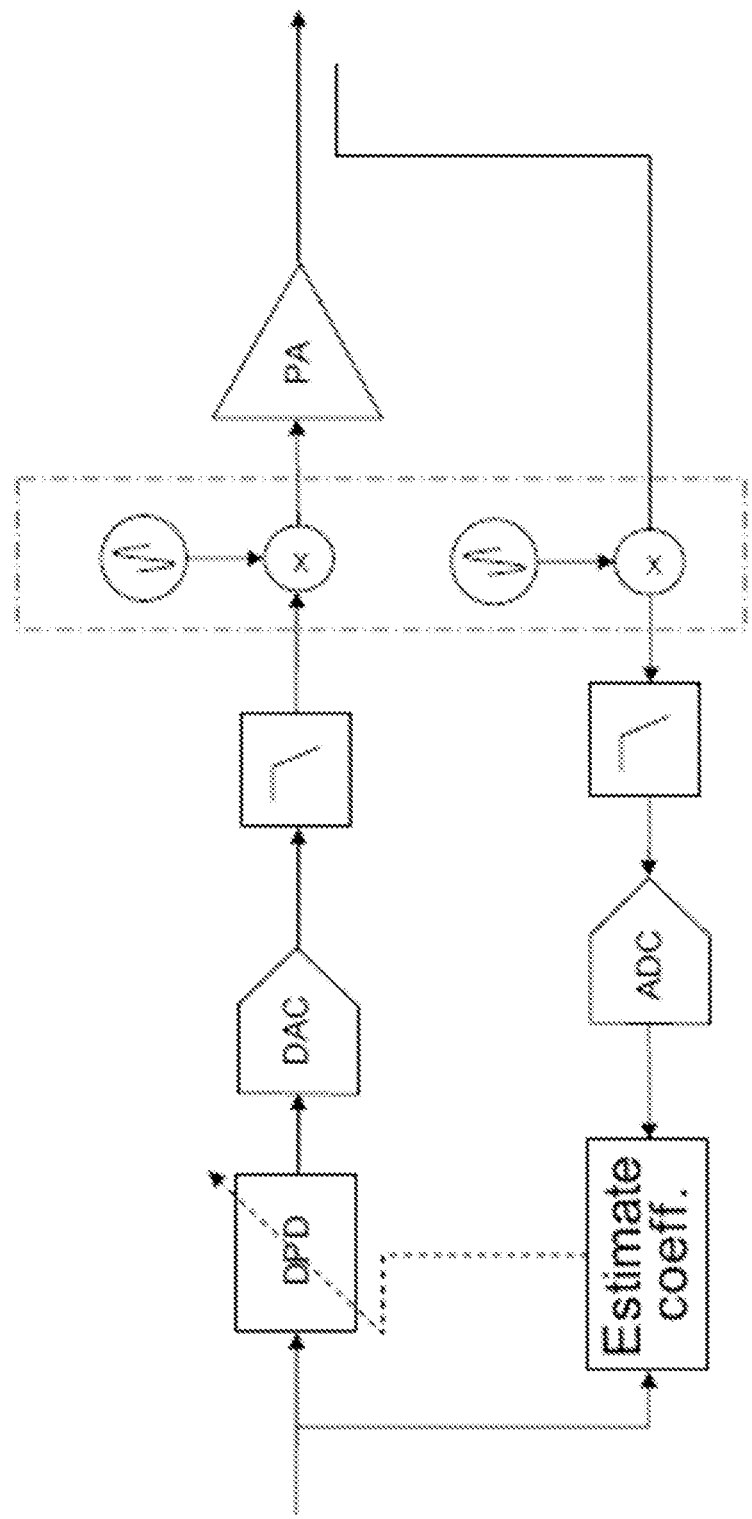
FIG. 1 is an illustration of an architecture of a transmitter device from the prior art carrying out predistortion processing.
Figure 2:
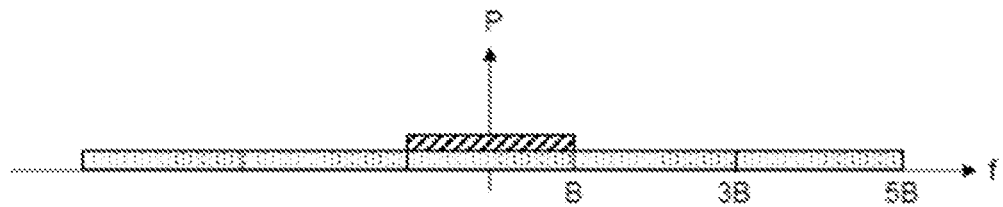
FIG. 2 is a schematic depiction of the spectrum of the signal at output of the power amplifier in a transmitter device exhibiting distortion.
Figure 3:
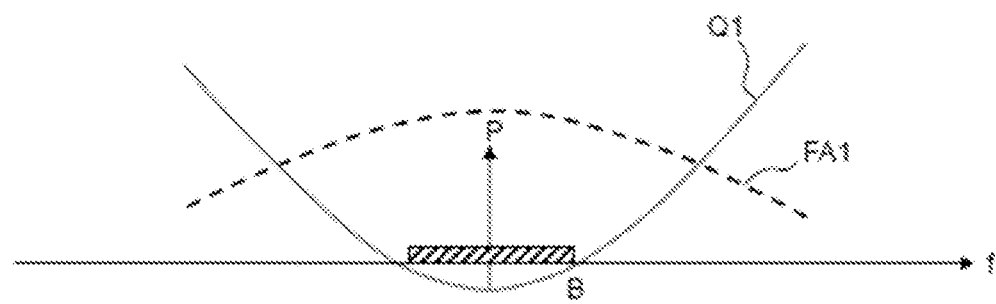
FIG. 3 is a schematic depiction of the spectrum of the signal at output of the power amplifier in a transmitter device comprising a sigma-delta encoder and a noise-shaping filter, without distortion.
Figure 4:
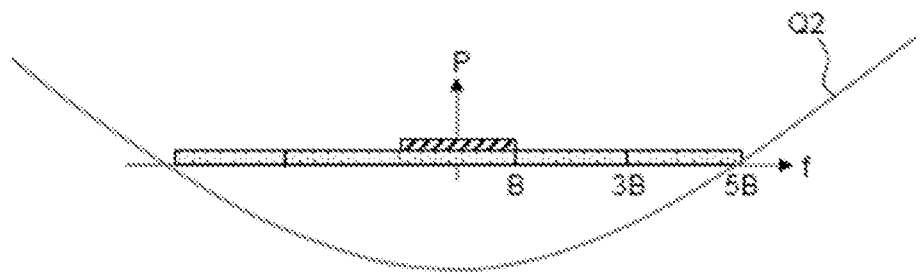
FIG. 4 is a schematic depiction of the spectrum of the signal at output of the power amplifier in a transmitter device comprising a sigma-delta encoder and a noise-shaping filter and carrying out predistortion processing.

The sigma-delta encoder has the same behaviour as in the case of FIG. 3, but within the bandwidth, the quantization noise is cancelled out so as to access the intermodulation signal present in the band from B to 5B.

Thus, in a transmitter device according to the invention, the same sampling frequency as considered in the case of FIG. 3 may be kept even if a predistortion is carried out.

Decorrelation

One of the effects of integrating the sigma-delta encoder into the transmission processing channel, as described above, is that of reducing the number of bits at input of the DAC 13, this being particularly critical in multichannel transmitter devices.

In addition, the proposed invention makes it possible to reduce oversampling frequency constraints, this being particularly critical in millimetric systems. In addition, these systems generally have less severe noise constraints in adjacent channels. This is therefore suitable more particularly for the proposed invention since a portion of the quantization noise is transmitted in the bands from B to 5B and is transmitted in the spectrum, thereby contaminating the adjacent channels. In the case of millimetric systems, the noise constraints in the adjacent channels are generally less severe.

It is often necessary, in the transmitter device architectures used for example to carry out digital beamforming, to have a large number of these channels in parallel in order to obtain a high gain in the desired direction. This large number of channels leads to a large silicon surface area and may lead to a high number of inputs/outputs. To limit the number of inputs/outputs, it is possible to use the same digital signal at input of all of the channels (I, respectively Q) and to carry out the beamforming by employing a different delay (and/or by employing phase-shifting of the signals) on each of the channels, so as to compensate for the time-of-flight difference between the signals.

In the case of multichannel architectures, using a sigma-delta encoder as proposed in FIG. 6 may prove problematic since, if the input signal is the same on each of the transmission processing channels, then the quantization noise will be the same on each of the channels and will therefore be added coherently during the beamforming, thereby increasing the noise in the band and outside the band. To this end, WO2020105040A1 proposes to implement the sigma-delta modulators separately from one another in order to reduce the correlation of the noise between the various channels.

Implementing predistortion in each of the channels of a transmitter device comprising N channels Vi, i=1 to N (N being an integer strictly greater than 1) each comprising a transmission processing channel and a return channel as considered above contributes to solving the problem regarding correlation of quantization noise. Indeed, it is highly likely that the coefficients of the various power amplifiers will be different from one another, which will make the input signals different from one another per se and will therefore decorrelate the quantization noise.

In one embodiment, such a multichannel transmitter device furthermore comprises a control block (not shown) implementing processing operations so as to:
- (i) guarantee that the noise is decorrelated before the predistortion is activated; and/or
- (ii) ensure that the sets of predistortion coefficients used by the DPDs at one and the same time in two different channels Vi, Vj, i≠j, do remain different.

One of the solutions is to oversize the size of the data paths in the predistortion circuits (that is to say the number of coding bits of the coefficients of the predistortion non-linear function and the associated calculations, a number B>0 of determined bits thus always taking the numerical value 0 due to the oversizing and then giving rise to measurement errors in analogue mode). It will thus be possible, in the first phase before initial estimation of the parameters of nonlinearities of the PAs, notably before calibration, to generate linearity errors below levels that degrade the performance of the transmitter device. These values will be different for each of the channels and will thus make it possible to decorrelate the quantization noise. This will also make it possible to increase the probability of having different coefficients for each of the channels or make it possible to modify them slightly in the event of equality without this having an impact on linearity performance. This will make it possible to avoid modifying the sigma-delta encoders on each of the channels, and these encoders will therefore remain very simple and identical on all of the channels.

Another alternative is to send deterministic signals to the input of the sigma-delta modulators at low levels and at frequencies such that these signals are filtered out by the analogue pass filter used in the transmitter, such that these signals do not appear at the output of the PA 16. It is possible to simply vary the amplitude or the frequency of these signals between the various channels. These signals may be simple square-wave signals, which are easy to generate. Last of all, it is also possible to ensure that, after beamforming, these deterministic signals cancel one another out in the desired transmission direction. Such deterministic signals are easy to generate, out of band (and therefore suppressed) and they are used only during the initial phase, before estimating the signal distortion coefficients in the operational phase.

Figure 9:
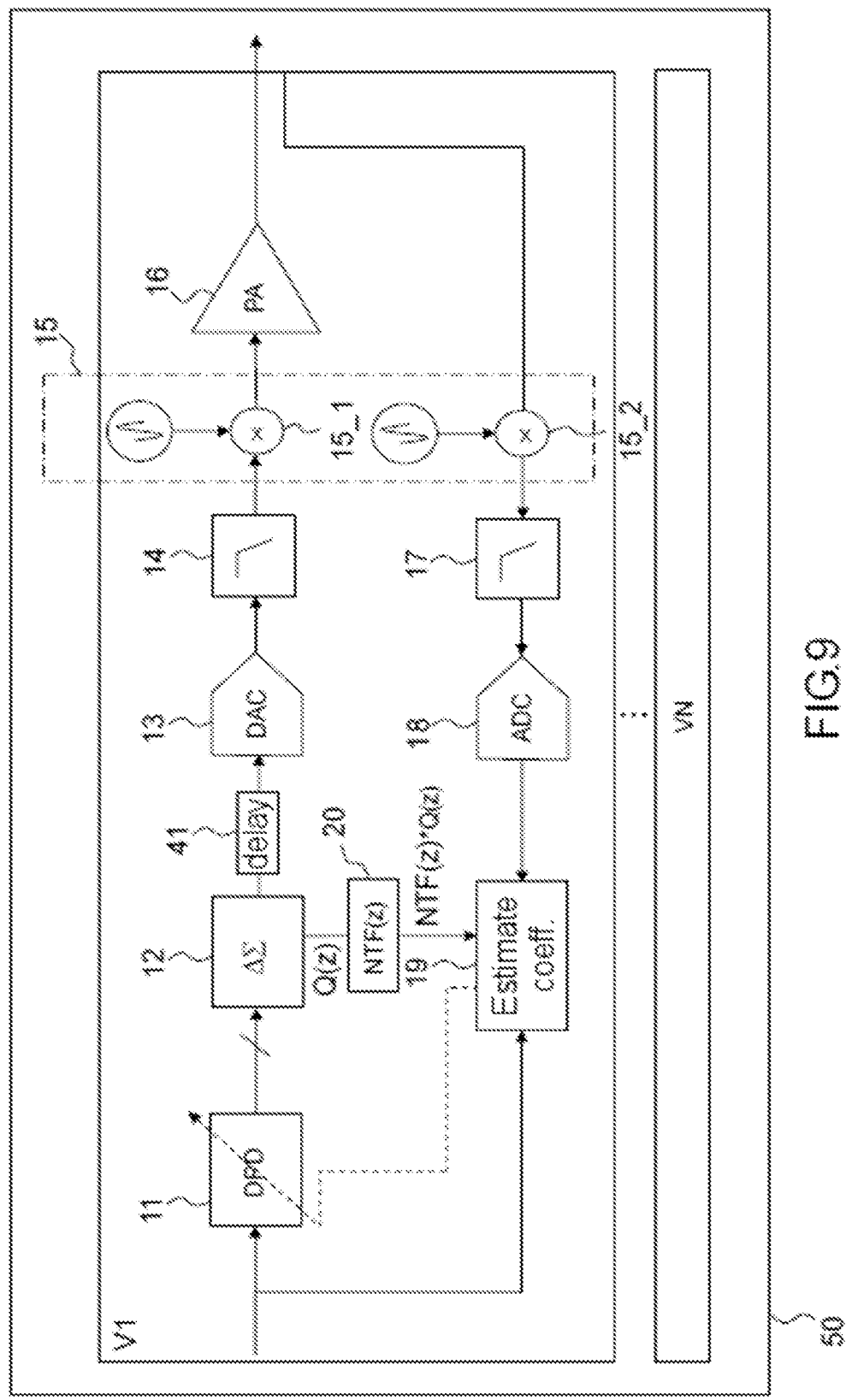
FIG. 9 is an illustration of an architecture of a transmitter device carrying out predistortion processing in one embodiment of the invention.

FIG. 9 shows a transmitter device 50 of the same type as the transmitter device 10 shown in FIG. 6, comprising N channels V1, . . . VN, each channel Vi comprising a transmission processing channel and a return channel, as described with reference to FIG. 6. A delay block 41 is furthermore inserted between the sigma-delta encoder 12 and the DAC 13. A portion of this delay may also be implemented in the DAC 13. This delay makes it possible to carry out the beamforming operation more effectively than with a phase shift. By virtue of the digital nature of the signal, the implementation of this delay is greatly simplified.

The invention has been described above in a radiofrequency transmission context, but the invention may of course be implemented in relation to other transmitter devices, for example those transmitting audio frequency signals, ultrasound, etc.

The invention claimed is:

1. A transmitter device comprising N channels Vi, i=1 to N≥1, each of said channels Vi comprising:
   a transmission processing channel designed to process an input signal and comprising a predistortion block, a digital-to-analogue converter, a first analogue filter and a power amplifier, said transmitter device comprising a transducer device coupled to said processing channel and receiving the input signal once it has been processed by said processing channel, the predistortion block being designed to apply a predistortion to said input signal, on the basis of predistortion coefficients, so as to compensate for the nonlinearities of the power amplifier;
   a return channel associated with the transmission processing channel, designed to receive the signal processed by the processing channel and comprising a second analogue filter, an analogue-to-digital converter, and a block for estimating predistortion coefficients, said block for estimating predistortion coefficients being designed to estimate predistortion coefficients, on the basis of at least said input signal and of a signal, called feedback signal, obtained following at least the successive operations, on the received processed signal, of filtering performed by the second filter and conversion performed by the analogue-to-digital converter, and to deliver said estimated predistortion coefficients to the predistortion block; wherein the processing channel furthermore comprises a sigma-delta encoder between the predistortion block and the digital-to-analogue converter, designed to carry out notably a quantization;
   said transmitter device wherein the block for estimating predistortion coefficients is designed to estimate said predistortion coefficients on the basis of at least said input signal and of a signal resulting from the subtraction, from said feedback signal, of a signal representing the quantization noise resulting from the quantization carried out by the sigma-delta encoder.

2. The wireless transmitter device according to claim 1, wherein said signal representing the quantization noise is a function of said quantization noise shaped by the noise transfer function NTF (z) of the sigma-delta encoder.

3. The wireless transmitter device according to claim 1, designed to obtain said signal representing the quantization noise by carrying out at least one of said following operations:
   filtering and decimation so as to adapt the sampling frequency and the bandwidth of the signal representing the quantization noise to the input signal;
   filtering so as to reproduce at least the effect of the first and second filters;
   FIR filtering so as to reproduce the effect of the first and second filters, the transfer function of said FIR filtering being estimated on the basis of the comparison between said feedback signal and a signal obtained from the quantization noise extracted from the sigma-delta encoder.

4. The transmitter device according to claim 1, wherein N>1.

5. The transmitter device according to claim 4, wherein the size of data paths in the block for estimating predistortion coefficients in each channel is oversized so as to introduce additional nonlinearities; and/or the transmitter device comprises a control block designed, in a preliminary transitional phase, to trigger the supply of deterministic signals to the input of the digital-to-analogue converters, such that, given any two separate channels, the amplitude and/or the frequency of these deterministic signals is different between said channels.

6. A method for predistortion in a transmitter device comprising N channels Vi, i=1 to N≥1, each of said channels Vi comprising:
   a transmission processing channel designed to process an input signal and comprising a predistortion block, a digital-to-analogue converter, a first analogue filter and a power amplifier, said transmitter device comprising a transducer device coupled to said processing channel and receiving the input signal once it has been processed by said processing channel, the predistortion block being designed to apply a predistortion to said input signal, on the basis of predistortion coefficients, so as to compensate for the nonlinearities of the power amplifier;
   a return channel associated with the transmission processing channel, designed to receive the signal processed by the processing channel and comprising a second analogue filter, an analogue-to-digital converter, and a block for estimating predistortion coefficients;
   wherein the processing channel furthermore comprises a sigma-delta encoder between the predistortion block and the digital-to-analogue converter, designed to carry out notably a quantization;
   said method comprising a step of estimating the predistortion coefficients performed by said block for estimating predistortion coefficients, on the basis of at least said input signal and of a signal, called feedback signal, obtained following at least the successive operations, on the received processed signal, of filtering performed by the second filter and conversion performed by the analogue-to-digital converter, said estimated predistortion coefficients being delivered to the predistortion block;
   said method wherein the block for estimating predistortion coefficients estimates said predistortion coefficients on the basis of at least said input signal and of a signal resulting from the subtraction, from said feedback signal, of a signal representing the quantization noise resulting from the quantization carried out by the sigma-delta encoder.

7. The method for predistortion in a transmitter device according to claim 6, wherein said signal representing the quantization noise is a function of said quantization noise shaped by the noise transfer function NTF (z) of the sigma-delta encoder.

8. The method for predistortion in a transmitter device according to claim 6, wherein said signal representing the quantization noise is obtained by carrying out at least one of said following operations:
   filtering and decimation so as to adapt the sampling frequency and the bandwidth of the signal representing the quantization noise to the input signal;
   filtering so as to reproduce at least the effect of the first and second filters;
   FIR filtering so as to reproduce the effect of the first and second filters, the transfer function of said FIR filtering being estimated on the basis of the comparison between said feedback signal and a signal obtained from the quantization noise extracted from the sigma-delta encoder.

9. The method for decorrelation of quantization noise in a transmitter device, wherein a predistortion calculation method according to claim 6 is implemented on each of the channels Vi, i=1 to N, with N being an integer >1.

10. The method for decorrelation of quantization noise in a transmitter device according to claim 9, comprising the following steps:
  the size of data paths in the block for estimating predistortion coefficients in each channel is oversized so as to introduce additional nonlinearities; and/or
  in a preliminary transitional phase, deterministic signals are supplied to the input of the digital-to-analogue converters, such that, given any two separate channels, the amplitude and/or the frequency of these deterministic signals is different between said channels.

* * * * *